(12) United States Patent
Li

(10) Patent No.: US 8,318,536 B2
(45) Date of Patent: Nov. 27, 2012

(54) UTILIZING APERTURE WITH PHASE SHIFT FEATURE IN FORMING MICROVIAS

(75) Inventor: Yonggang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 667 days.

(21) Appl. No.: 11/967,862

(22) Filed: Dec. 31, 2007

(65) Prior Publication Data

US 2009/0170239 A1 Jul. 2, 2009

(51) Int. Cl.
*H01L 21/00* (2006.01)

(52) U.S. Cl. ........ 438/106; 438/116; 438/463; 438/487; 219/212.6; 219/121.62; 219/121.68; 257/E21.499; 257/E21.596

(58) Field of Classification Search ........................ None
See application file for complete search history.

(56) References Cited

U.S. PATENT DOCUMENTS

| | | | |
|---|---|---|---|
| 5,489,509 A * | 2/1996 | Kawabata et al. ................ 430/5 |
| 5,876,878 A * | 3/1999 | Pierrat et al. ..................... 430/5 |
| 6,159,462 A * | 12/2000 | Matthews et al. ............. 424/85.1 |
| 6,171,739 B1 * | 1/2001 | Spence et al. .................... 430/30 |
| 6,190,986 B1 * | 2/2001 | Arndt et al. .................... 438/381 |
| 6,233,098 B1 * | 5/2001 | Plesko .......................... 359/666 |
| 6,593,793 B1 * | 7/2003 | Braunisch et al. ............. 327/291 |
| 6,627,978 B2 * | 9/2003 | Dujari et al. ................... 257/667 |
| 6,653,052 B2 * | 11/2003 | Tanaka et al. ................. 430/311 |
| 6,800,401 B2 * | 10/2004 | Petersen .......................... 430/5 |
| 6,855,945 B1 * | 2/2005 | Silder ......................... 250/505.1 |
| 7,008,738 B2 * | 3/2006 | Dulman et al. .................... 430/5 |
| 7,520,248 B1 * | 4/2009 | Linker ........................... 119/174 |
| 2002/0177054 A1 * | 11/2002 | Saitoh et al. .................... 430/22 |
| 2003/0203290 A1 * | 10/2003 | Misaka ........................... 430/5 |
| 2004/0161678 A1 * | 8/2004 | Misaka ............................ 430/5 |
| 2004/0185348 A1 * | 9/2004 | Progler ........................... 430/5 |
| 2005/0084769 A1 * | 4/2005 | Pinkerton et al. ................ 430/5 |
| 2005/0177809 A1 * | 8/2005 | Kamat et al. .................... 716/19 |
| 2006/0014381 A1 * | 1/2006 | Lee ............................... 438/638 |
| 2006/0199083 A1 * | 9/2006 | Sinha et al. ...................... 430/5 |
| 2007/0160919 A1 * | 7/2007 | Chen et al. ....................... 430/5 |

* cited by examiner

*Primary Examiner* — Charles Garber
*Assistant Examiner* — Yasser Abdelaziez
(74) *Attorney, Agent, or Firm* — Blakely, Sokoloff, Taylor & Zafman LLP

(57) ABSTRACT

A method, comprises drilling a set of one or more microvias in a semiconductor package with an aperture, wherein drilling the set of microvias comprises to use an aperture that has a phase shift region to reduce a spot size of a drilling beam that is used to form the set of microvias.

12 Claims, 3 Drawing Sheets

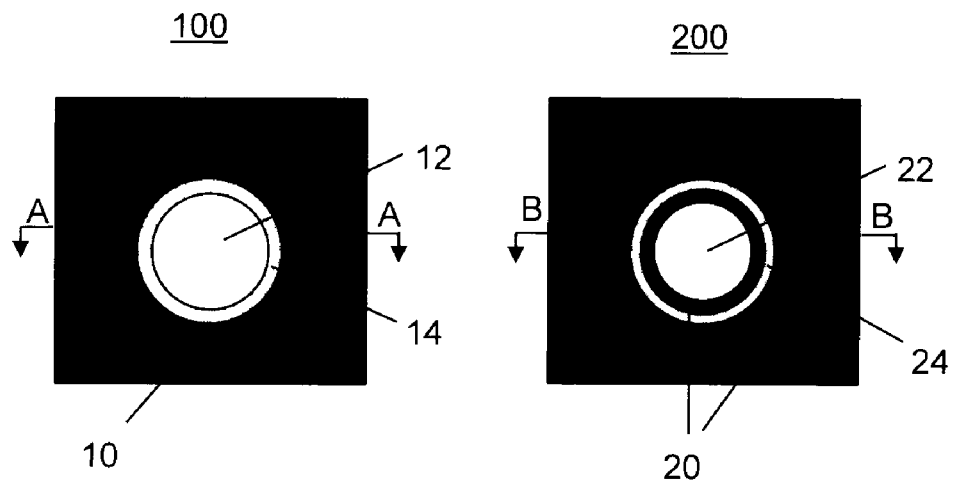
Fig. 1A        Fig. 1B
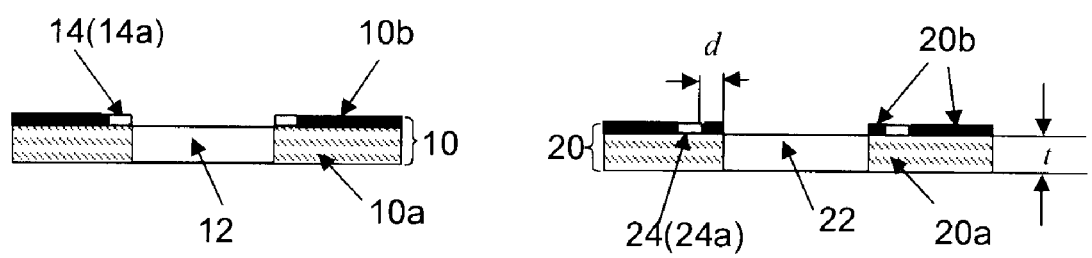
Fig. 2A        Fig. 2B
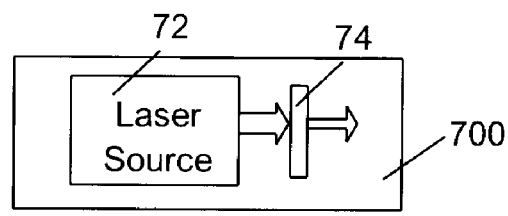
Fig. 7

UTILIZING APERTURE WITH PHASE SHIFT FEATURE IN FORMING MICROVIAS

BACKGROUND

A semiconductor package may comprise one or more semiconductor dies that may be attached to a substrate. A die may be both electrically and mechanically coupled to a substrate using, for example, a flip-chip interconnect technique or by wirebonding in conjunction with a die-attach adhesive. A laser drilling system, e.g., $CO_2$ laser drillers, may be used to form microvias in a semiconductor package, e.g., die, substrate or any other component, to form the interconnection between different layers of electrical circuit. For example, a substrate may comprise a multi-layer structure. And, microvias may be used to interconnect circuits on different layers of the substructure. Apertures with one or more openings may be used in the laser drillers to control an intensity of a laser beam. Several factors may impact a size of a microvia, including, e.g., aperture opening, laser wavelength, laser intensity, diffraction of the laser, as well as other factors. The ever-increasing I/O density of integrated circuits may demand a reduced microvia size. For a given laser source, some limitation for microvia size shrinkage may comprise a diffraction of the laser beam through the aperture opening.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

FIGS. 1A and 1B are schematic diagrams of an embodiment of an aperture that may comprise phase shift feature, respectively.

FIGS. 2A and 2B are cross-sectional diagrams of the apertures of FIGS. 1A and 1B, respectively.

FIG. 7 is an schematic diagram according to some embodiments of the invention.

DETAILED DESCRIPTION

Figure 3:
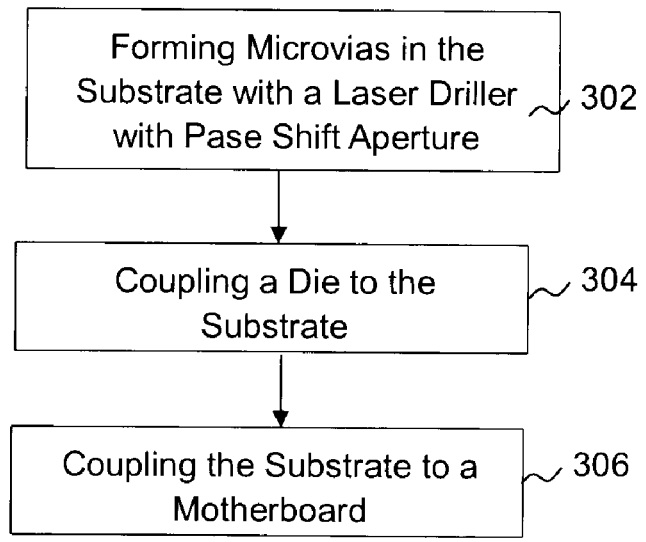
FIG. 3 is a schematic diagram of an embodiment of a method that may be used to form a semiconductor package.

In the following detailed description, references are made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numbers refer to the same or similar functionality throughout the several views.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The following description may include terms, such as upper, lower, top, bottom, first, second, etc. that are used for descriptive purposes only and are not to be construed as limiting.

FIG. 1A illustrates an exemplary embodiment of an aperture 100 that may comprise a phase shifting feature. FIG. 2A is a cross-sectional diagram of the aperture 100 that may be obtained along the A-A line of FIG. 1A. Referring to FIG. 1A, in one embodiment, the aperture 100 may comprise a first region 10 that may be opaque to a laser beam. Referring to FIG. 2A, the aperture 100 may comprise a dielectric layer or a base layer 10a. The dielectric layer 10a may be transmissive to a laser beam. Any suitable materials may be used for the dielectric layer 10a, including, e.g., zinc selenide, and germanium that may be used for $CO_2$ lasers, and silica and quartz that may be used for ultraviolet (UV) lasers, or any other transmissive materials. In another embodiment, the first region 10 may further comprise a coating 10b. Any suitable materials may be used for the coating 10b, including, e.g., chrome, gold, silver, aluminum, or any other metal, or other materials that may be opaque to a laser beam. In one embodiment, the coating 10b may have a thickness (e.g., around 100 nm or above) that may prevent a laser beam to pass through.

With reference to FIG. 1A, in one embodiment, the aperture 100 may comprise an opening 12 for a laser beam to pass through. In another embodiment, the aperture 100 may comprise a phase shift region 14 that may be provided on the dielectric layer 10a. In one embodiment, the aperture 100 may border the opening 12. For example, a spacing between the opening 12 and the phase shift region 14 may equal to zero. In another embodiment, the phase shift region 14 may be provided at the edge of the opening 12. In yet another embodiment, the phase shift region 14 may be surrounded by the coating 10b.

In another embodiment, the phase shift region 14 may be partially transmissive to a laser beam. A laser beam that passes or transmits through the phase shift region 14 may be reversed in phase, e.g., being shifted by around 180° or around 180°+360°*N in phase, wherein N may equal to any integer. In one embodiment, a first laser radiation that passes through the phase shift region 14 may interfere destructively with a second laser radiation that passes through the opening 12. For example, the destructive interference may happen at a border of the first laser radiation and the second laser radiation or on the edge of the second laser radiation. The phase shift region 14 may comprise a film 14a of metal and/or ceramic material. Example materials for the film 14 may comprise one or more selected from a group of gold, silver, aluminum, aluminum oxide, zirconium oxide and/or any other metals or ceramic materials. In one embodiment, the film 14 may have a thickness (e.g., on a nanometer level) that may reduce an intensity of a laser beam that passes through the phase shift region 14. In another embodiment, an area of the phase shift region 14 may be smaller that an area of the opening 12. In some embodiments, the film 14 may have a thickness that a phase change of a laser beam that passes through the film 14 due to the film 14 may be ignored.

Referring to FIGS. 1B and 2B, another embodiment of an aperture 200 is illustrated. Similar to the embodiment of FIGS. 1A and 2A, the aperture 200 may comprise a second region 20 that may be opaque to a laser and an opening 22 that may be transmissive to a laser beam. The aperture 200 may comprise a dielectric layer 20*a*. In one embodiment, the aperture 200 may further comprise a phase shift region 24 that may be provided on the dielectric layer 20*a* and may surround the opening 22. The phase shift region 24 may comprise a film 24*a* of metals and/or ceramic materials. Referring to 1B, a spacing d between the phase shift region 24 and the opening 22 may not equal to zero. In another embodiment, the spacing d may be selected to provide the (e.g., maximum) destructive interference. In another embodiment, the second region 20 may further comprise a coating 20*b* that may be provided on the dielectric layer 20*a* where the phase shift region 24 is absent. The coating 20*b* may be opaque to an incident laser beam. The phase shift region 24 may be partially transmissive to a laser beam and may reverse the laser beam in phase, e.g., by around 180° or around 180°+360°*N in phase, wherein N may equal to any integer.

Referring to FIG. 2A, the following expression may be used to represent an optical path difference OPD of a first laser radiation in the phase shift region 24 and a second laser radiation in the opening 22:

$$OPD=(n-1)t \qquad (1)$$

where n may represent the refractive index of the dielectric layer 10*a* and t may represent a thickness of the phase shift region 14 or the dielectric layer 10*a*. In one embodiment, the first laser radiation may interfere destructively with the second laser radiation (e.g., on the edge). The optical path difference OPD that provides the destructive interference may be represent as follows:

$$OPD=(2m+1)\pi\lambda \qquad (2)$$

where λ may represent the wavelength of the first laser radiation and/or the second laser radiation and m may be any integer. From the two expressions (1) and (2), the thickness t of the dielectric layer 20*a* may be determined based on the following expression:

$$t = \frac{(2m+1)\pi}{n-1}\lambda \qquad (3)$$

In one embodiment, m may be equal to zero or be any positive integer, while n is greater than 1. In another embodiment, a thickness of the phase shift region 10 or 20 may be selected to provide the reversed phase for a laser beam that passes through the phase shift region.

FIG. 3 illustrates an embodiment of a method that may be used to form a semiconductor package. Referring to FIG. 3, in block 302, an aperture, e.g., 100 or 200 may be provided in an optical path between a laser source and an object (e.g., substrate) where a microvia to be formed; however, some embodiments may use the aperture to form one or more microvias or one or more vias in any other component (e.g., die) of a semiconductor package. Some embodiments may utilize any other aperture with a phase shift region to reduce a spot size of a laser beam or any other drilling beam that passes through an opening of the aperture by destructive interference at an outer portion of the laser beam. In some embodiments, a reduction in an intensity of the laser beam may be ignored. In one embodiment, the aperture may comprise an opening that may be positioned to match a location of a microvia to be formed. In block 304, a die may be electrically and/or mechanically coupled to the substrate obtained in block 302 that may comprise the one ore more microvias to form a semiconductor package. In block 306, the package may be coupled to a motherboard.

Figure 5:
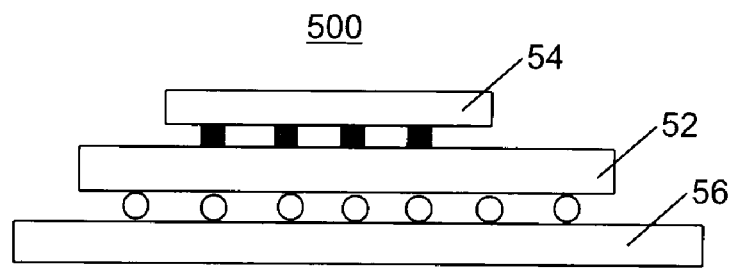
FIG. 5 is a schematic diagram of an embodiment of a semiconductor package.
Figure 6A:
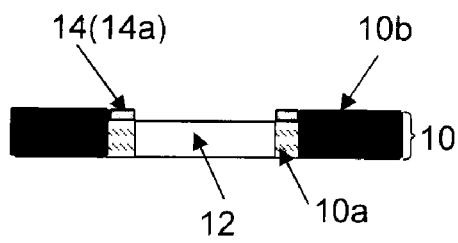
FIGS. 6A to 6D are schematic diagrams according to some embodiments of the invention.
Figure 6B:
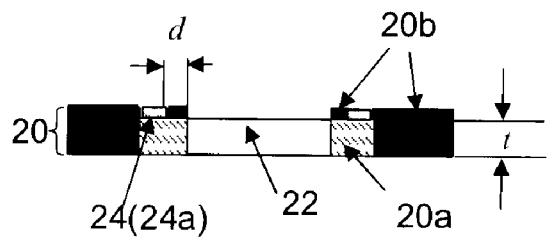
Figure 6C:
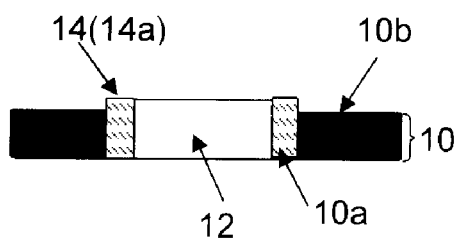
Figure 6D:
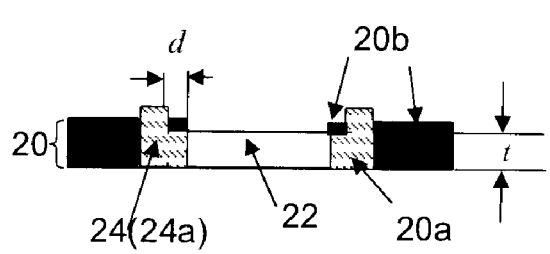

FIG. 5 illustrates an embodiment of a semiconductor package 500 that may comprise a die 54 that may be coupled to a substrate 52 with one or more interconnects, such as one or more bumps, gold stud bumps, conductive protrusions or any other interconnects. The substrate 52 may be coupled to a motherboard 58 via one or more solder balls or any other external interconnects such as pin grid array (PGA). The substrate 52 may be a multi-layered structure that may have one or more layers of microvias.

Referring to FIG. 7, a system 700 (e.g., laser driller) may be used to provide one or more microvias. In one embodiment, the system 700 may comprise a laser source 72 that may provide a laser to provide a microvia in, e.g., a substrate and/or any other component in a semiconductor package; however, any other drilling beam source may be utilized to provide any other drilling beam. In another embodiment, the system 700 may comprise an aperture 72 to reduce a spot of the laser beam from the laser source 72.

Figure 4:
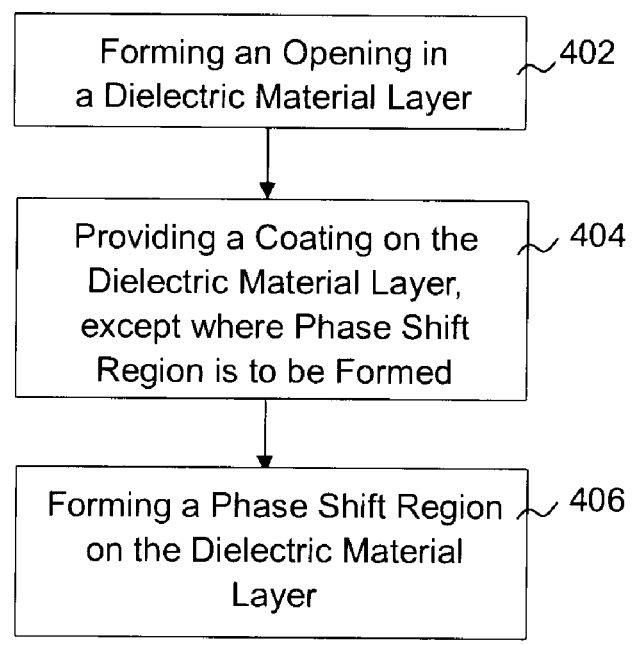
FIG. 4 is a schematic diagram of an embodiment of a method that may be used to form an aperture.

FIG. 4 illustrates an embodiment of a method that may be used to provide an aperture. The method may be described in conjunction with FIG. 1A and/or FIG. 2A as an example. Referring to FIG. 4, in block 402, an opening 12 may be formed in the dielectric layer 10*a*. For example, the dielectric layer 10*a* may be cut to form the opening 12; however, in some embodiments, any other suitable ways may be used to form the opening 12. In block 404, a coating 10*b* may be selectively provided on the dielectric layer 10*a* where the phase shift region 14 is absent. In one embodiment, a mask may be used to form the coating 10*b*. In block 406, a film 14*a* that may reduce an intensity of a laser beam may be provided on the dielectric layer 10*a* to form a phase shift region 14. For example, a film 14*a* may be, e.g., electroplated, deposited or coated on the dielectric layer 10*a*.

Referring to FIG. 6, some embodiments of the apertures are illustrated. As seen from 6A and 6D, the first region 10 and the second region 20 may not comprise the dielectric layer 10*a* or 20*a*. Further, referring to FIGS. 6C and 6D, the dielectric layer 10*a* or 20*a* may have a thickness that may allow the phase shift region to reverse a phase of a laser beam that passes through the phase shift region and the film 14*a* may not be required. As seem from FIG. 6B, a portion of the second region 20*a* may comprise the dielectric layer 20*a*. However, some embodiments may have any other suitable structure.

While the methods of FIGS. 3 and 4 are illustrated to comprise a sequence of processes, the method in some embodiments may perform illustrated processes in a different order. In another embodiment, the method of FIG. 4 may vary based on a structure of an aperture.

While certain features of the invention have been described with reference to embodiments, the description is not intended to be construed in a limiting sense. Various modifications of the embodiments, as well as other embodiments of the invention, which are apparent to persons skilled in the art to which the invention pertains are deemed to lie within the spirit and scope of the invention.

What is claimed is:

1. A method, comprising:
    drilling a set of one or more microvias in a semiconductor package with an aperture;
    wherein drilling the set of microvias comprises to use the aperture that has a base layer with an opening formed in the base layer, wherein the aperture further comprises an opaque layer formed on the base layer and a phase shift region formed in the opaque layer such that the phase shift region is adjacent to and surrounding the opening in the base layer.

2. The method of claim 1, wherein the phase shift layer comprises a dielectric layer that is partially transmissive to the first drilling beam.

3. The method of claim 1, wherein the aperture further comprises a region that is opaque to the first drilling beam and surrounds the phase shift layer.

4. The method of claim 1, wherein the base layer comprises a first opaque region and a second opaque region that are opaque to the first drilling beam, wherein the phase shift layer is between the first opaque region and a second opaque region.

5. The method of claim 1, wherein the phase shift layer is to shift the phase of the first drilling beam to provide a destructive interference between the first drilling beam and a second drilling beam that is to pass through the opening.

6. The method of claim 1, wherein a spacing between the opening and the phase shift layer equals to zero.

7. The method of claim 5, wherein a spacing between the opening and the phase shift layer is to provide the destructive interference, and wherein an opaque coating is formed on the base layer.

8. The method of claim 1, wherein the phase shift layer has a thickness to provide the reversed phase.

9. The method of claim 1, wherein the phase shift layer is to shift the phase of the first drilling beam by around $180°\pm360°*N$ in phase, wherein N is an integer.

10. The method of claim 1, wherein the phase shift layer has a thickness that is to provide the reversed phase.

11. The method of claim 1, wherein the phase shift layer comprises a thickness that is determined based on a wavelength of the drilling beam.

12. The method of claim 1, wherein the phase shift layer is provided on a wall of the opening.

* * * * *